United States Patent
He

(10) Patent No.: US 12,159,059 B2
(45) Date of Patent: Dec. 3, 2024

(54) COMMAND SEQUENCE TO SUPPORT ADAPTIVE MEMORY SYSTEMS

(71) Applicant: Micron Technology, Inc., Boise, ID (US)

(72) Inventor: Deping He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 17/818,922

(22) Filed: Aug. 10, 2022

(65) Prior Publication Data

US 2024/0053922 A1    Feb. 15, 2024

(51) Int. Cl.
   *G06F 3/06*    (2006.01)

(52) U.S. Cl.
   CPC .......... *G06F 3/0659* (2013.01); *G06F 3/0619* (2013.01); *G06F 3/0652* (2013.01); *G06F 3/0679* (2013.01)

(58) Field of Classification Search
   CPC ...... G06F 3/0604; G06F 3/061; G06F 3/0614; G06F 3/0616; G06F 3/0619; G06F 3/0652; G06F 3/0659; G06F 3/0679; G06F 3/0688; G06F 12/0246; G06F 12/0253
   USPC ......... 711/127, 104, 154; 710/5, 74; 714/6.1
   See application file for complete search history.

(56) References Cited

U.S. PATENT DOCUMENTS

| | | | |
|---|---|---|---|
| 7,559,004 B1* | 7/2009 | Chang | H03M 13/09 |
| | | | 714/708 |
| 2015/0143035 A1* | 5/2015 | Choi | G06F 3/0661 |
| | | | 711/103 |
| 2016/0307633 A1* | 10/2016 | Lee | G11C 16/3454 |
| 2021/0173644 A1* | 6/2021 | Bains | G06F 3/0659 |
| 2023/0058238 A1* | 2/2023 | Saeki | G03G 15/2053 |
| 2023/0068702 A1* | 3/2023 | Muchherla | G11C 29/028 |

FOREIGN PATENT DOCUMENTS

| | | | |
|---|---|---|---|
| CN | 115793959 A | * | 3/2023 |
| KR | 20150059056 A | * | 5/2015 |

* cited by examiner

*Primary Examiner* — Ilwoo Park

(74) *Attorney, Agent, or Firm* — Holland & Hart LLP

(57) ABSTRACT

Methods, systems, and devices for commands to support adaptive memory systems are described. A memory system may be configured to receive a command to perform an operation on an address of a memory system, the command including an indication of a count of program/erase cycles associated with the address; determine whether the count of program/erase cycles associated with the address satisfies a threshold; adjust a trim parameter for operating the memory system based at least in part on determining that the indication of the count of program/erase cycles satisfies the threshold; and perform the operation associated with the command using the adjusted trim parameter.

24 Claims, 7 Drawing Sheets

COMMAND SEQUENCE TO SUPPORT ADAPTIVE MEMORY SYSTEMS

FIELD OF TECHNOLOGY

The following relates to one or more systems for memory, including commands to support adaptive memory systems.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Systems for memory, including commands to support adaptive memory systems are disclosed. Memory devices and systems are widely used to store information. One type of memory is known as NAND memory. NAND memory is a type of non-volatile storage technology that may be erased in blocks and written and read in pages. The lifespan of NAND or other non-volatile memory may depend on wear caused by the quantity of times a particular memory block has been written and erased. The more cycles of writing and erasing on a particular block, the shorter the lifespan of that block that is remaining. Enhancing performance of NAND memory may reduce the lifespan or usability of NAND memory, so there is a balance between NAND performance and reliability.

Flash storage devices (such as NAND memory) may write data in increments of pages but may erase data in increments of blocks (which are bigger than pages). This may result in blocks keeping invalid data for a long time. The pages with invalid data are marked for deletion, valid data are moved to a free block, and the device is permitted to erase the block containing invalid data.

A host system may manage various trim parameters used by a memory system to operate. Allowing the host system to configure trim parameters may increase control signaling between the host system and the memory system. The additional control signaling may impact performance of the memory system because management of the trim process by the host system may cause the quality of service (QoS) of a memory system to drop (e.g., increase latency for performing commands issued by the host system). For example, updating trim parameters may create a cost in terms of development schedule, quality assurance (QA), and validation. During this process, a significant amount of signaling between the host and the memory system may occur, which may use a larger quantity of computing resources and may create a cost for the memory system.

The host system may know a program/erase cycle (PEC) count for each block and may convey this information to the memory system to allow the memory system to manage trim parameters used to operate the memory system, thereby improving system performance. A modified program sequence may include communicating a PEC in messaging from the host system to the memory system, thereby allowing the memory system to manage its own trim process and improving the QoS of the memory system.

Figure 1:
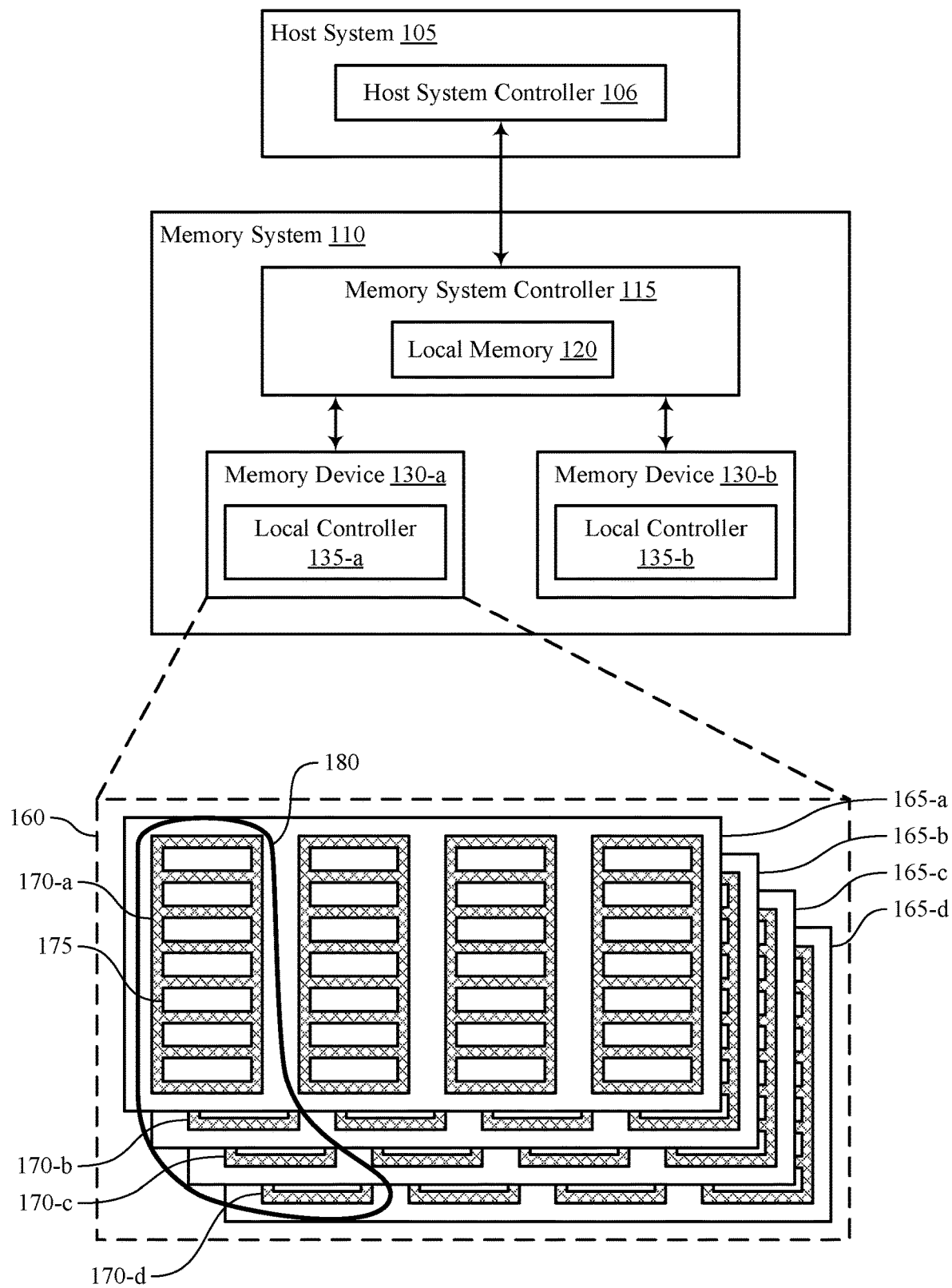
FIG. 1 illustrates an example of a system that supports commands to support adaptive memory systems in accordance with examples as disclosed herein.
Figure 2:
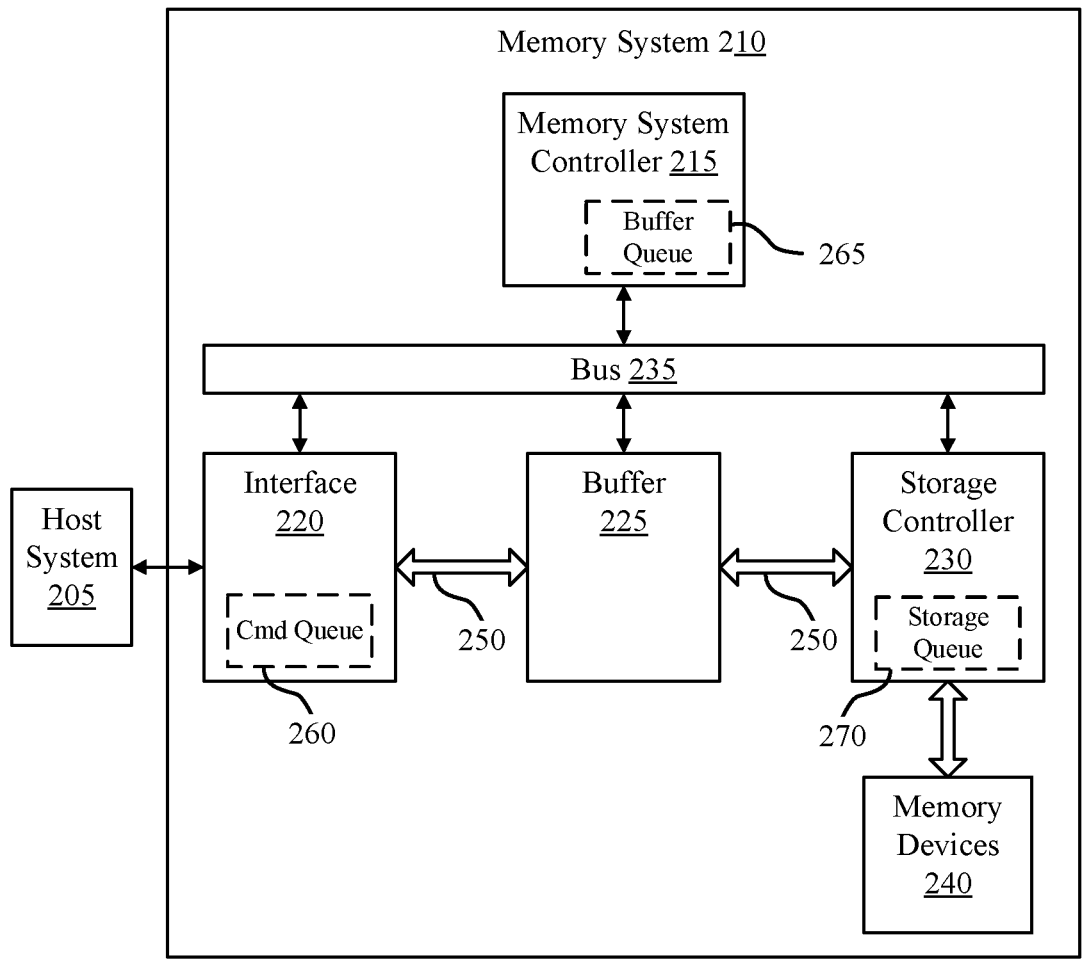
FIG. 2 illustrates an example of a system that supports commands to support adaptive memory systems in accordance with examples as disclosed herein.

Features of the disclosure are initially described in the context of systems, devices, and circuits with reference to FIGS. 1 through 2. Features of the disclosure are described in the context of an system diagram, a programming sequence, and a method diagram with reference to FIGS. 3 through 5. These and other features of the disclosure are further illustrated by and described in the context of an apparatus diagram and flowchart that relate to commands to support adaptive memory systems with reference to FIGS. 6 through 7.

FIG. 1 illustrates an example of a system 100 that supports commands to support adaptive memory systems in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support commands to support adaptive memory systems. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the host system 105 may manage various trim parameters used by the memory system 110 to operate. Allowing the host system 105 to configure trim parameters may use significant control signaling between the host system 105 and the memory system 110. The additional control signaling may impact performance of the memory system 110 because management of the trim process by the host system 105 may cause the QoS of the memory system 110 to drop (e.g., by increased latency for performing commands issued by the host system 105). For example, updating trim parameters may create a cost in terms of development schedule, QA, and validation. During this process, a significant amount of signaling between the host system 105 and the memory system 110 may occur, which may use a larger quantity of computing resources and may create a cost for the memory system 110.

In some examples, a host system 105 may know a PEC count for each block 170 of a memory system 110. A host system 105 may convey this information to the memory system 110 to allow the memory system 110 to manage trim parameters used to operate the memory system 110, thereby improving system performance. A modified program sequence may include communicated a PEC in messaging from the host system 105 to the memory system 110, thereby allowing the memory system 110 A host system 105 may convey this information to the memory system 110 to allow the memory system 110 to manage trim parameters used to operate the memory system 110, thereby improving system performance. A modified program sequence may include communicated a PEC in messaging from the host system 105 to the memory system 110, thereby allowing the memory system 110 to manage its own trim process and improving the QoS of the memory system 110.

FIG. 2 illustrates an example of a system 200 that supports commands to support adaptive memory systems in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, after completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. After receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

After a determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, performing garbage collection). The entries may be added to the storage queue 270, e.g., by the memory system controller 215. The entries may be removed from the storage queue 270 (e.g., by the storage controller 230 or memory system controller 215) after completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, in response to the data transfer to the buffer 225 being completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, the memory system controller 215 associated with the memory system 210 may be configured to cause an apparatus to receive a command to perform an operation on an address of the memory system 210. The command may include an indication of a count of program/erase cycles associated with the address. The memory system controller 215 may determine whether the count of program/erase cycles associated with the address satisfies a threshold and adjust a trim parameter for operating the memory system 210 based at least in part on determining that the indication of the count of program/erase cycles satisfies the threshold. The memory system controller 215 may perform the operation associated with the command using the adjusted trim parameter.

In some examples, the memory system controller 215 may cause the apparatus to determine whether to adjust a distribution of a states stored in a memory cell based at least in part on determining that the count of program/erase cycles satisfies the threshold. Adjusting the trim parameter may be based at least in part on determining to adjust the distribution of the states. The memory system controller 215 may be configured to cause the apparatus to determine whether to adjust a duration for performing a programming operation based at least in part on determining that the count of program/erase cycles satisfies the threshold, where adjusting the trim parameter is based at least in part on determining to adjust the duration for performing the programming operation. The memory system controller 215 may also be configured to cause the apparatus to determine whether to improve a reliability of data stored at the address of the memory system 210 based at least in part on determining that the count of program/erase cycles satisfies the threshold, where adjusting the trim parameter is based at least in part on determining to improve the reliability of the data stored at the address.

Figure 3:
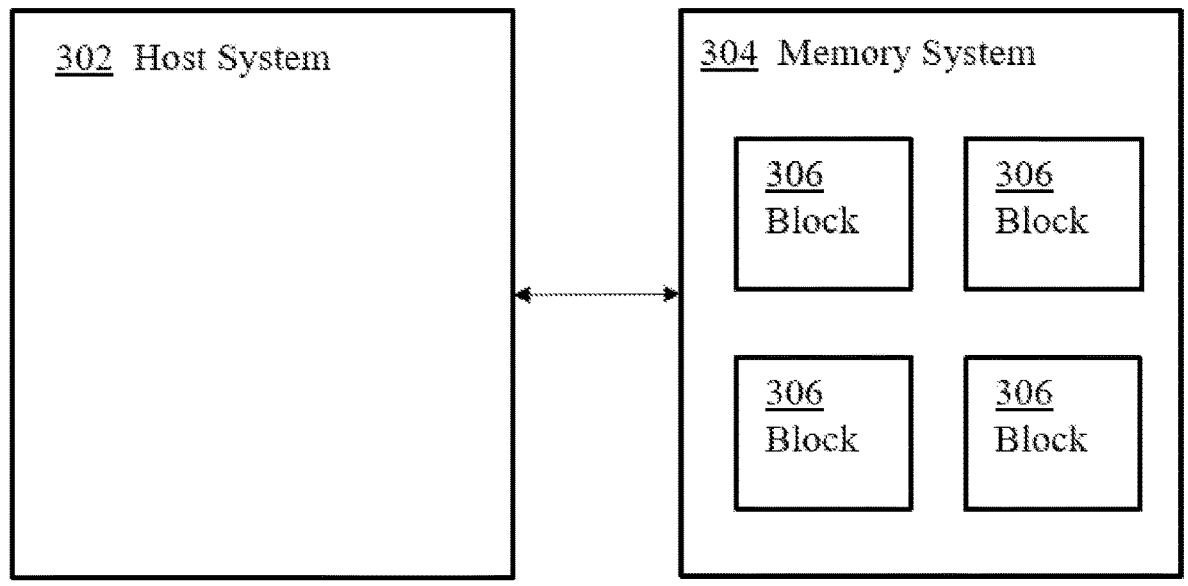
FIG. 3 illustrates an example of a host system and a memory system that supports commands to support adaptive memory systems in accordance with examples as disclosed herein.

FIG. 3 illustrates an example system 300 that may include a host system 302 and a memory system 304 that supports commands to support adaptive memory systems in accordance with examples as disclosed herein. The memory system 304 may include a number of blocks 306. The memory system 304 may include a NAND that may adjust trims using procedures such as widening or narrowing each distribution associated with the different levels stored in the memory cell, shortening or extending a duration of the program speed, increasing or decreasing a bit error rate associated with read operations, adjusting a first voltage threshold used as part of erase operations and a second voltage threshold used as part of write operations, or adjusting some or all voltage thresholds by an offset, or any combination thereof. In memory system 304 operations, some techniques may be used in response to programming the upper page to achieve tighter Vt distributions. After each programming pulse, there may be two program verify operations that occur for each target distribution. The first program verify operation may be performed approximately 200 mV-300 mV below the final program verify level. The second program verify operation may be the true program verify read. This adjustment may be used to slow programming for fast bits whose Vt has exceed some levels, or the like. With adaptive trims, the memory system 304 may be changed based on the cycling.

Such adaptive features may adjust memory system 304 trims based on program erase cycles. Adaptative features may extend the reliability and lifetime of the memory system 304 at higher PECs. While adaptive trims may be managed by a host system 302 that may determine when to and how to adjust trims, activation may modify several trims during erase/program/read operations. Such modification may cause QoS to drop because of the increased signaling used to manage the changes of the trim parameters. Adaptative memory system 304 features may also be planned ahead by the host system 302, and any new scheme may negatively affect the development schedule and QA/validation schedule, or the like.

In some examples, if the memory system 304 is refreshed, performance may be improved and wear on the device may be lessened. One or more individual blocks 306 of the memory system 304 may be refreshed in response to the PEC reaching a threshold. The one or more individual blocks may be determined to be close to the end of its life, for example. In one example, after 60-70% of the cycling for a block 306 is reached, the system 300 may slow down the memory system 304 program. In some examples, there may be different types of distributions. For example, a wide distribution or a narrow distribution may be used. If using a relatively fast program, the system 300 may use wide distribution and, conversely, may use a tighter or narrower distribution with slower programs, or the like.

The system 300 may utilize adaptive trims, or the like. Wide memory system 304 distributions may be used to increase performance (e.g., speed) and narrow memory system 304 distributions may be used to increase reliability, durability, and longevity. The system 300 may balance performance and reliability, or the like. The memory system may use window re-ration, or the like. With window re-ratio, the system 300 may change a program profile to modify system performance, or the like.

While trim parameters may be managed by the host system 302, doing so creates a cost. For example, allowing the host system 302 to configure trim parameters may increase control signaling between the host system 302 and the memory system 304. The additional control signaling may impact performance of the memory system 304 because management of the trim process by the host system 302 may cause the QoS of the memory system 304 to drop (e.g., increase latency for performing commands issued by the host system 302). For example, updating trim parameters may create a cost in terms of development schedule, QA, and validation. During this process, a significant amount of signaling between the host system 302 and the memory system 304 may occur, which may use a larger quantity of computing resources and may create a cost for the memory system 304.

In some examples, trim parameters may be managed by the memory system 304. The memory system 304 may perform media management and perform trim parameter adjustment. Trim parameter management performed by the memory system 304 addresses challenges that occur with trim parameter management performed by the host system 302. For example, different blocks 306 may be written on in the center of the block 306 and then another block may be written on with trim parameter changes. Different blocks 306 may have different PEC at the same time. Different blocks 306 may benefit from using different trim parameters and a different type of management may be applied to each block 306. In accordance with some examples, the memory system 304 may receive a PEC count from the host system 302 via a program sequence for each block 306 to manage the trim parameters for each block 306.

Figure 4:
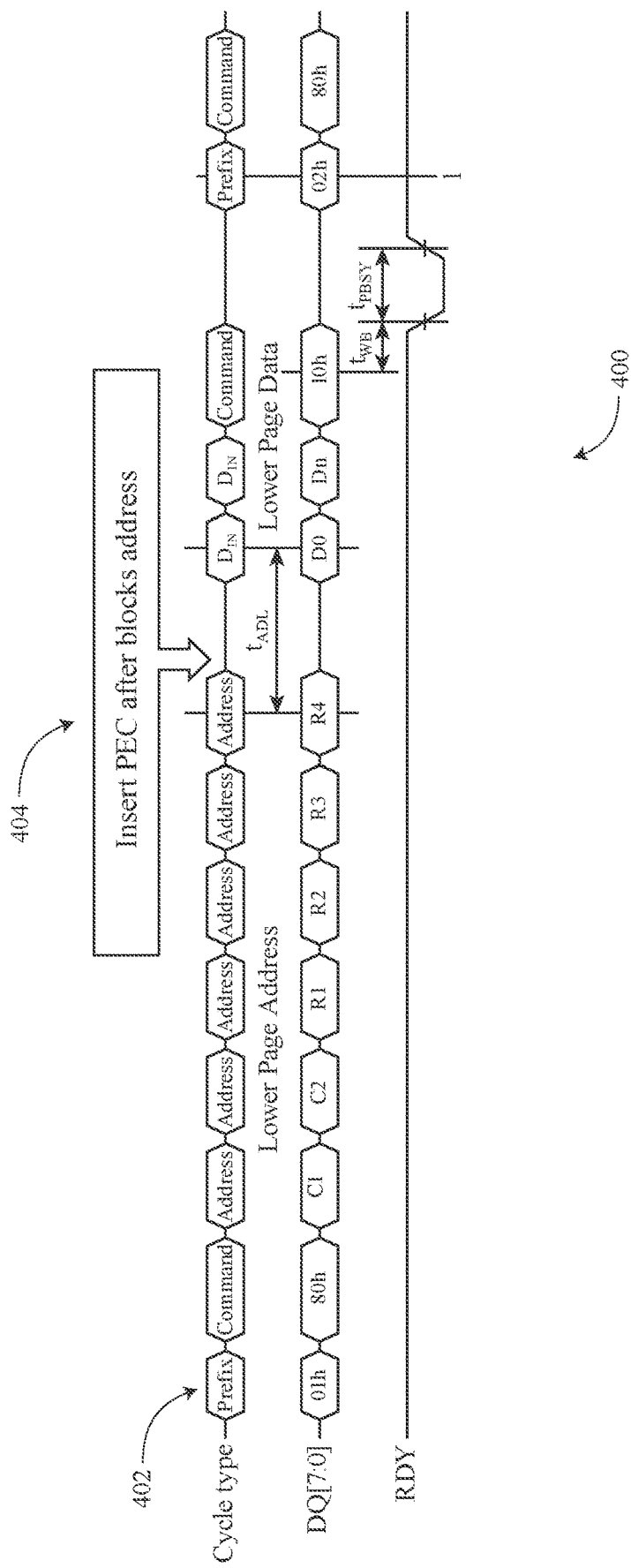
FIG. 4 illustrates an example of a program sequence that supports commands to support adaptive memory systems in accordance with examples as disclosed herein.

FIG. 4 illustrates an example of a program sequence 400 that supports a commands to support adaptive memory systems in accordance with examples as disclosed herein. In some examples, a PEC count 404 may be inserted within a sequence of one or more commands 402 to communicate a PEC count 404 to the memory system. In some examples, the PEC count 404 may be inserted after the block addresses, or the like. This insertion of the PEC count 404 may allow the memory system to manage different blocks with different cycling requirements and allow the memory system to modify the trim parameters for each individual block. A block may include a physical block, a virtual block, a group of blocks, or the like. Each block or group of blocks may use a different management scheme and allowing the memory system to manage the trim parameters may improve QoS, or the like. Signaling between the host system and the memory system may be reduced, thereby reducing the cost of the host system performing trim parameter management, or the like. The number of blocks the host system adjusts and the associated signaling from the host to the memory system to convey the related instructions and commands is costly. The transition time due to the signaling may cause discontinuity of the QoS. Allowing the memory system to manage this process may reduce the signaling from the host to the memory system and thereby improve QoS.

Memory system blocks may be grouped into cycle groups, or the like. Jumping from the management of one cycle group to another causes a QoS issue. This back-and-forth management may cause increased system development time and QA validation schedule time. If a host system performs trim parameter management, the host system may proactively plan the trim parameters ahead to reduce lagging and latency with adaptive trims. Due to this pre-planning, there is a period where the adaptive trims are not being used, and the system may also operate sub-optimally during those times. If additional adaptive trims are to be used, scheduling may also be delayed.

In some examples, the memory system may manage trim parameters for every block. The host system knows the PEC count 404, and how many cycles have been completed, for each block. If the system completes an erase of a block, the system may check the PEC count 404 or how many cycles have occurred on a given block. The memory system may manage the trim parameters for each block within the memory system in response to receiving the PEC count 404 from the host system in a sequence of one or more commands 402. The host system may track the PEC count 404 for the different blocks on a block-by-block basis for purposes of tracking a wear level for each block. A memory system may balance the PEC count for each block, so that each block within the memory system may be used equally, or the like.

In some examples, the host system may track the PEC count and send commands to the memory system for the memory system to erase, program, or read a block or group of blocks, or the like. The host system may send the PEC count 404 in the sequence of one or more commands 402 with other commands, or the like. The memory system may receive the PEC count 404 so the memory system can perform adaptive adjustment of trim parameters based on the PEC count 404. The memory system may have the autonomy to manage itself and perform adaptive adjustment of trim parameters for each block based on the PEC count 404 received as part of the sequence of one or more commands 402 from the host system, or the like.

In some examples, PEC counts 404 may be associated with physical blocks, virtual blocks, or groups of blocks. The host system may manage a group of blocks (e.g., 4-8 blocks) together so that each block in the group of blocks may have an identical or substantially similar PEC and each of the groups of blocks may have an identical or substantially similar PEC. The host system may assist with logical block management to make each block wear evenly and make the memory system more reliable.

In some examples, the PEC counts 404 included in the sequence of one or more commands 402 may be an example of an integer value of PEC counts. For example, the field in the sequence of one or more commands 402 may indicate that some integer value of counts are associated with a particular block. In some examples, the PEC counts 404 included in the sequence of one or more commands 402 may be an example of an index that indicates the PEC counts are in a range of integer values. In such examples, the integer values of PEC counts may be quantized and categorized into ranges of values. The memory system may use the index value of the PEC counts to determine what trim parameters to use for the block.

Trim parameters for the block may be adjusted based on the PEC count associated with the block. Early in the life of the block (e.g., the PEC count of the block is relatively low), the trim parameters may be adjusted to improve the performance of the block. For example, trim parameters may be adjusted to increase the speed of the memory system (e.g., reduce the latency of performing commands). In such examples, trim parameters may be set so that data is written quickly into the memory system. Such trim parameters may increase a write amplification associated with the memory system or other operating parameters. Later in the life of the block (e.g., the PEC count of the block is relatively high), the trim parameters may be adjusted to improve the reliability of the block and/or extend the life of the block. As the memory system ages, voltage distributions in memory cells may shift or other phenomenon may occur. As such, trim parameters may be adjusted to decrease a likelihood of errors in the data by improving the placement of voltages in memory cells and/or by widening the read window budget between states stored by a memory cell. Such trim parameters, however, may also slow down the speed of writing the data into the memory system. Additionally or alternatively, the use of a write booster may be reduced as the block ages to reduce write amplification associated with transferring data from the SLC blocks of the write booster buffer to TLC blocks.

Figure 5:
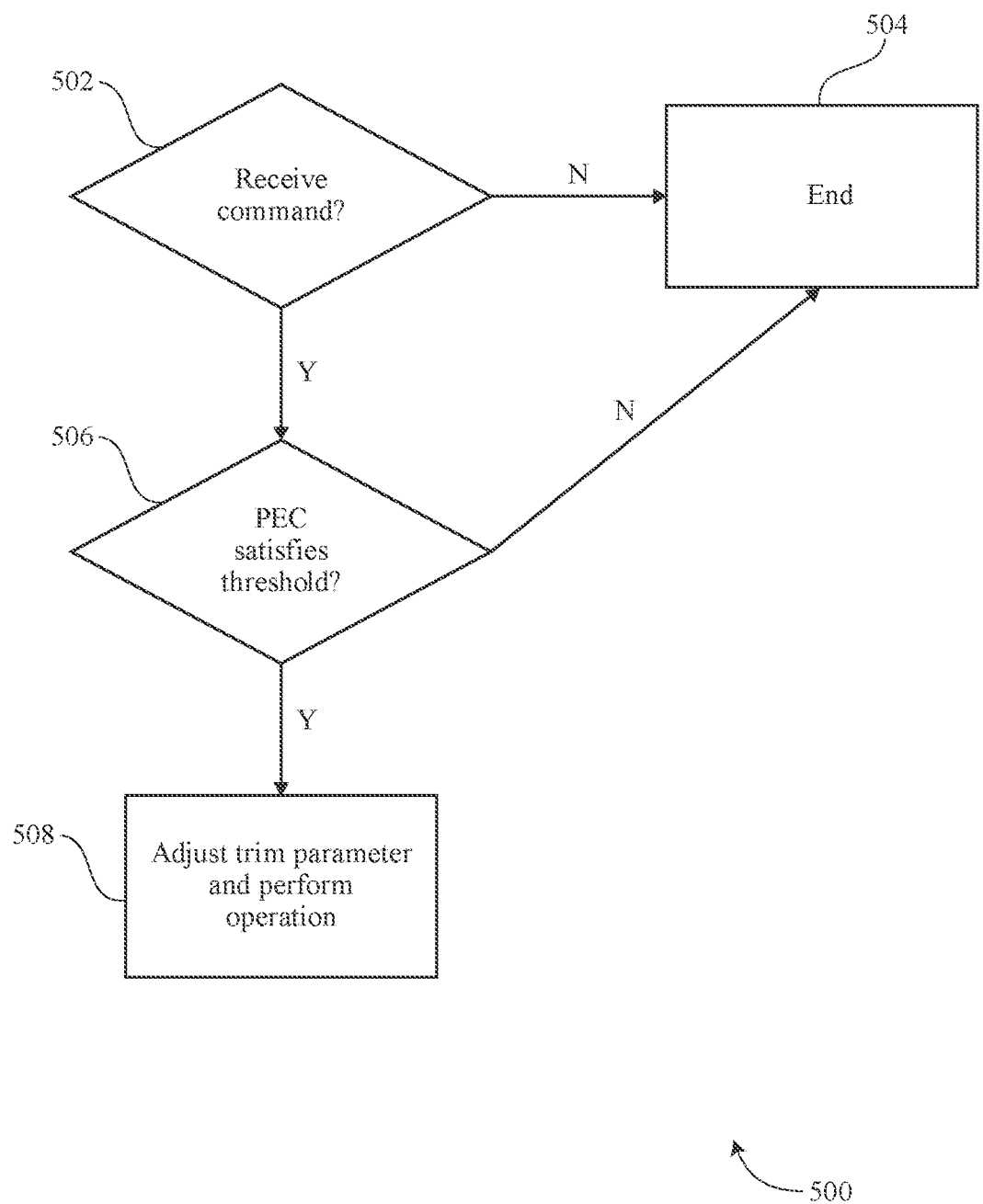
FIG. 5 illustrates an example of a method of a trim process that supports commands to support adaptive memory systems in accordance with examples as disclosed herein.

FIG. 5 illustrates an example of a method 500 of a trim process that supports commands to support adaptive memory systems in accordance with examples as disclosed herein. In some cases, trim parameters that may be configured to improve to enhance the reliability of a memory system may negatively affect the performance (e.g., latency) of the memory system. Thus, there may be a balance between reliability and performance. At 502, a controller associated with a memory device may cause an apparatus to receive a command to perform an operation on an address of a memory system. The command may include an indication of a PEC count associated with the address of the memory system. If the controller does not receive a command to perform an operation on an address of the memory system, the method ends at 504.

At 506, the controller may determine whether the PEC count associated with the address satisfies a threshold. If the PEC count associated with the address does not satisfy the threshold, the method ends at 504. If the PEC count associated with the address satisfies the threshold, at 508, trim parameters may be adjusted by the controller associated with the memory device based at least in part on determining that the PEC count satisfies the threshold, and the operation associated with the command may be performed.

At 508, the trim parameters may be adjusted to balance performance and reliability of the memory system. For example, the memory system may slow down performance as the blocks starts to degrade after a period of normal operation, thereby slowing down the degrading process. In some examples, the command to perform an operation on an address of a memory system may include a small amount of storage space, for example, one bit for the PEC count. Adding one bit to the command for the PEC count costs an insignificant amount of time, for example, a few nanoseconds. The host system may add this one piece of information to the command.

In some examples, trim parameter adjustment may be completed by the memory system in response to receiving the PEC count from the host. In some examples, the memory system may use different trim parameters for different thresholds of PEC counts. For example, the memory system may use a first set of trim parameters after the PEC count surpasses 70% of useful life for a block, and a second set of trim parameters after the PEC count surpasses 80% of useful life for a block, or the like.

In systems where the host system configures the trim parameters, typically adjustment is completed once or twice for each block. In some examples, the memory system may have more opportunities to do this because the signaling requirements between the host system and the memory system are removed. There may be little performance penalty, if any, in allowing the memory system to configure the trim parameters, because the memory system may perform this trim parameter adjustment in the background.

In some examples, one advantage of allowing the memory system to perform trim parameter adjustment is it can be more flexible than the host system. For example, a host system may change the trim parameters immediately with a command sequence. In contrast, a memory system may perform trim adjustment after higher priority commands are completed and if impact on performance of the memory system may be lessened. The memory system may perform trim adjustment in the background, where impact on the performance of the system may be lower than allowing the host system to perform the trim parameter adjustment. If the host system performs trim parameter adjustment, it may be disruptive to the memory system. In some examples, these kinds of interactions between the host system and the memory system may be reduced or minimized due to QoS concerns.

In some examples, the memory system may perform trim parameter adjustment based on a lookup table. The memory system may utilize ranges of PEC counts to perform some trims. In some examples, the memory system may receive the PEC count and identify which trim parameter adjustment scheme, or the like, to use based on the lookup table and the PEC count. A lookup table may include, for example, ranges of PEC counts for trim parameter adjustment schemes, or the like. In some examples, the memory system may perform trim parameter adjustment in real-time and sets of trim parameter adjustment schemes may be adjusted without communication from the host to the memory system, or the like. The host system may signal commands to the memory system to make trim adjustments or multiple adjustments, there may be a cost associated with the messaging used between the host system and the memory system.

In some examples, the memory system may determine whether to implement an adaptive change immediately based on a lookup table or if there is a series of trim adjustments, the memory system may perform some or all of the series of trim adjustments in response to processing power or bandwidth being available to complete the trim adjustments without affecting performance of the system. The host system may send the PEC count to the memory system with every command sequence. In some examples, the host system may send the PEC count at some intervals (e.g., periodically), such as after a duration of time or a quantity of commands, or the like. Each block may have a different PEC. For example, some blocks may have a PEC of 80, 90, 100, 110 cycles, or the like. In some examples, a lookup table or resolution key may provide the memory system with an identification of what trim adjustment to perform. For example, a PEC from 0-99 may mean a first trim adjustment, a PEC from 100-199 may mean a second trim adjustment, a PEC of 200-299 may mean a third trim adjustment and a PEC from 300-399 may mean a fourth trim adjustment according to the lookup table or resolution key. The memory system may receive the actual PEC number from the memory system or just the range the PEC is in.

Figure 6:
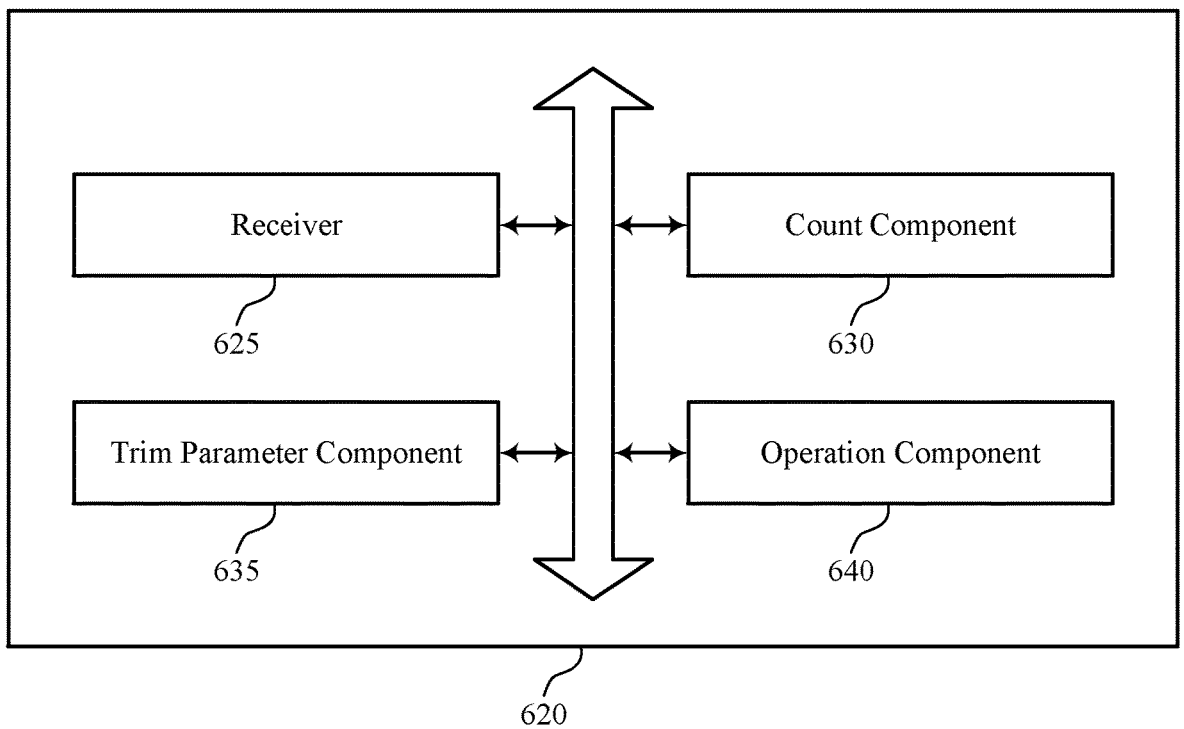
FIG. 6 shows a block diagram of a memory system that supports commands to support adaptive memory systems in accordance with examples as disclosed herein.

FIG. 6 shows a block diagram 600 of a memory system 620 that supports commands to support adaptive memory systems in accordance with examples as disclosed herein. The memory system 620 may be an example of aspects of a memory system as described with reference to FIGS. 1 through 5. The memory system 620, or various components thereof, may be an example of means for performing various aspects of commands to support adaptive memory systems as described herein. For example, the memory system 620 may include a receiver 625, a count component 630, a trim parameter component 635, an operation component 640, or any combination thereof. Each of these components may communicate, directly or indirectly, with one another (e.g., via one or more buses).

The receiver 625 may be configured as or otherwise support a means for receiving a command to perform an operation on an address of a memory system, the command including an indication of a count of program/erase cycles associated with the address. The count component 630 may be configured as or otherwise support a means for determining whether the count of program/erase cycles associated with the address satisfies a threshold. The trim parameter component 635 may be configured as or otherwise support a means for adjusting a trim parameter for operating the memory system based at least in part on determining that the indication of the count of program/erase cycles satisfies the threshold. The operation component 640 may be configured as or otherwise support a means for performing the operation associated with the command using the adjusted trim parameter.

In some examples, the trim parameter component 635 may be configured as or otherwise support a means for determining whether to adjust a distribution of a states stored in a memory cell based at least in part on determining that the count of program/erase cycles satisfies the threshold, where adjusting the trim parameter is based at least in part on determining to adjust the distribution of the states.

In some examples, the trim parameter component 635 may be configured as or otherwise support a means for determining whether to adjust a duration for performing a programming operation based at least in part on determining that the count of program/erase cycles satisfies the threshold, where adjusting the trim parameter is based at least in part on determining to adjust the duration for performing the programming operation.

In some examples, the trim parameter component 635 may be configured as or otherwise support a means for determining whether to improve a reliability of data stored at the address of the memory system based at least in part on determining that the count of program/erase cycles satisfies the threshold, where adjusting the trim parameter is based at least in part on determining to improve the reliability of the data stored at the address.

In some examples, the trim parameter component 635 may be configured as or otherwise support a means for determining a value for the adjusted trim parameter based at least in part on values stored in the memory system associated with the count of the program/erase cycles and the trim parameter, where adjusting the trim parameter is based at least in part on determining the value.

In some examples, the receiver 625 may be configured as or otherwise support a means for receiving a second command to perform a second operation on the address of the memory system, where the second command fails to include the indication of the count of program/erase cycles associated with the address.

In some examples, the address includes a physical block of the memory system, a virtual block of the memory system, or a group of physical blocks of the memory system.

In some examples, the indication of the count includes an integer value of program/erase cycles associated with the address. In some examples, the indication of the count includes an integer value of the count of the program/erase cycles associated with the address. In some examples, the indication of the count includes an index value that indicates the count is in a range of integer values. In some examples, the indication of the count includes an index value of two bits that indicates whether the count is within one of four ranges. In some examples, a program/erase cycle includes how often a particular location in the memory system has been accessed.

In some examples, the trim parameter indicates how the memory system is operated. In some examples, the trim parameter indicates a voltage level of signals applied to various components in the memory system. In some examples, the trim parameter indicates a duration for applying signals to various components in the memory system. In some examples, the trim parameter indicates one or more threshold voltages compared with signals of the memory system.

In some examples, the one or more threshold voltages are used in comparators to determine information about signals. In some examples, the operation includes a trim operation in response to the adjusted trim parameter. In some examples, the threshold includes a value relative to a total quantity of expected program erase cycles associated with the address. In some examples, the threshold includes 20%, 40%, 60%, or 80% of the total quantity of expected program erase cycles.

In some examples, the indication of the count of program/erase cycles associated with the address includes one bit of the command. In some examples, the indication of the count of program/erase cycles associated with the address is positioned after the address in the command. In some examples, the trim parameter is adjusted after higher priority commands are completed by the memory system.

In some examples, the memory system adjusts the trim parameter for operating the memory system based at least in part on values for the trim parameter stored in the memory system.

In some examples, the indication of the count of program/erase cycles associated with the address is in one of every N integer commands received by the memory system.

In some examples, the indication of the count of program/erase cycles associated with the address is in every command received by the memory system.

Figure 7:
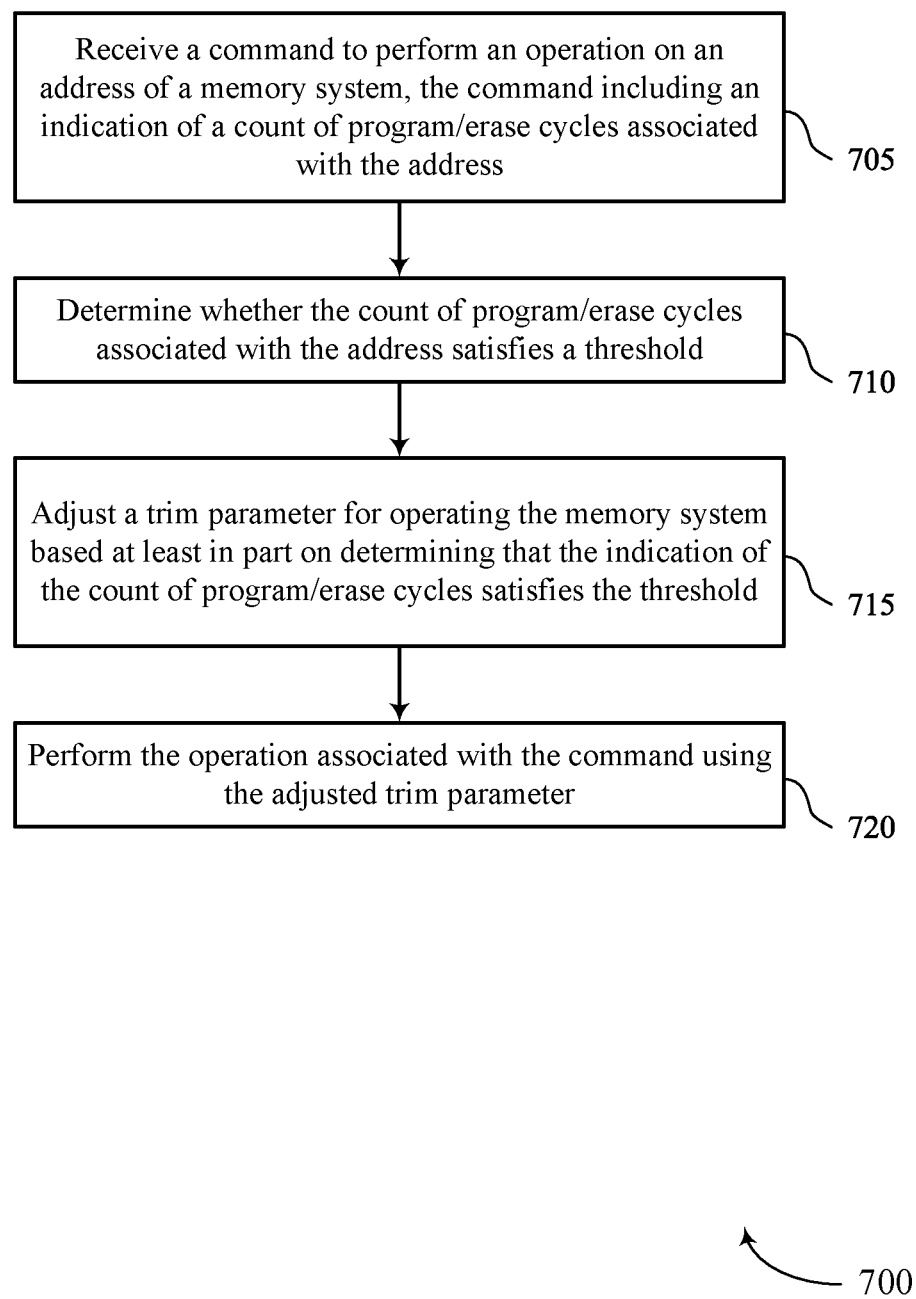
FIG. 7 shows a flowchart illustrating a method or methods that support commands to support adaptive memory systems in accordance with examples as disclosed herein.

FIG. 7 shows a flowchart illustrating a method 700 that supports commands to support adaptive memory systems in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include receiving a command to perform an operation on an address of a memory system, the command including an indication of a count of program/erase cycles associated with the address. The operations of 705 may be performed in accordance with examples as disclosed herein. In some examples, aspects of the operations of 705 may be performed by a receiver 625 as described with reference to FIG. 6.

At 710, the method may include determining whether the count of program/erase cycles associated with the address satisfies a threshold. The operations of 710 may be performed in accordance with examples as disclosed herein. In some examples, aspects of the operations of 710 may be performed by a count component 630 as described with reference to FIG. 6.

At 715, the method may include adjusting a trim parameter for operating the memory system based at least in part on determining that the indication of the count of program/erase cycles satisfies the threshold. The operations of 715 may be performed in accordance with examples as disclosed herein. In some examples, aspects of the operations of 715 may be performed by a trim parameter component 635 as described with reference to FIG. 6.

At 720, the method may include performing the operation associated with the command using the adjusted trim parameter. The operations of 720 may be performed in accordance with examples as disclosed herein. In some examples, aspects of the operations of 720 may be performed by an operation component 640 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a command to perform an operation on an address of a memory system, the command including an indication of a count of program/erase cycles associated with the address; determining whether the count of program/erase cycles associated with the address satisfies a threshold; adjusting a trim parameter for operating the memory system based at least in part on determining that the indication of the count of program/erase cycles satisfies the threshold; and performing the operation associated with the command using the adjusted trim parameter.

Aspect 2: The method, apparatus, or non-transitory computer-readable medium of aspect 1, further including operations, features, circuitry, logic, means, or instructions, or any combination thereof for determining whether to adjust a distribution of a states stored in a memory cell based at least in part on determining that the count of program/erase cycles satisfies the threshold, where adjusting the trim parameter is based at least in part on determining to adjust the distribution of the states.

Aspect 3: The method, apparatus, or non-transitory computer-readable medium of any of aspects 1 through 2, further including operations, features, circuitry, logic, means, or instructions, or any combination thereof for determining whether to adjust a duration for performing a programming operation based at least in part on determining that the count of program/erase cycles satisfies the threshold, where adjusting the trim parameter is based at least in part on determining to adjust the duration for performing the programming operation.

Aspect 4: The method, apparatus, or non-transitory computer-readable medium of any of aspects 1 through 3, further including operations, features, circuitry, logic, means, or instructions, or any combination thereof for determining whether to improve a reliability of data stored at the address of the memory system based at least in part on determining that the count of program/erase cycles satisfies the threshold, where adjusting the trim parameter is based at least in part on determining to improve the reliability of the data stored at the address.

Aspect 5: The method, apparatus, or non-transitory computer-readable medium of any of aspects 1 through 4, further including operations, features, circuitry, logic, means, or instructions, or any combination thereof for determining a value for the adjusted trim parameter based at least in part on values stored in the memory system associated with the count of the program/erase cycles and the trim parameter, where adjusting the trim parameter is based at least in part on determining the value.

Aspect 6: The method, apparatus, or non-transitory computer-readable medium of any of aspects 1 through 5, further including operations, features, circuitry, logic, means, or instructions, or any combination thereof for receiving a second command to perform a second operation on the address of the memory system, where the second command fails to include the indication of the count of program/erase cycles associated with the address.

Aspect 7: The method, apparatus, or non-transitory computer-readable medium of any of aspects 1 through 6, where the address includes a physical block of the memory system; a virtual block of the memory system; or a group of physical blocks of the memory system.

Aspect 8: The method, apparatus, or non-transitory computer-readable medium of any of aspects 1 through 7, where the indication of the count includes an integer value of program/erase cycles associated with the address.

Aspect 9: The method, apparatus, or non-transitory computer-readable medium of any of aspects 1 through 8, where the indication of the count includes an integer value of the count of the program/erase cycles associated with the address.

Aspect 10: The method, apparatus, or non-transitory computer-readable medium of any of aspects 1 through 9, where the indication of the count includes an index value that indicates the count is in a range of integer values.

Aspect 11: The method, apparatus, or non-transitory computer-readable medium of any of aspects 1 through 10, where the indication of the count includes an index value of two bits that indicates whether the count is within one of four ranges.

Aspect 12: The method, apparatus, or non-transitory computer-readable medium of any of aspects 1 through 11, where a program/erase cycle includes how often a particular location in the memory system has been accessed.

Aspect 13: The method, apparatus, or non-transitory computer-readable medium of any of aspects 1 through 12, where the trim parameter indicates how the memory system is operated.

Aspect 14: The method, apparatus, or non-transitory computer-readable medium of any of aspects 1 through 13, where the trim parameter indicates a voltage level of signals applied to various components in the memory system.

Aspect 15: The method, apparatus, or non-transitory computer-readable medium of any of aspects 1 through 14, where the trim parameter indicates a duration for applying signals to various components in the memory system.

Aspect 16: The method, apparatus, or non-transitory computer-readable medium of any of aspects 1 through 15, where the trim parameter indicates one or more threshold voltages compared with signals of the memory system.

Aspect 17: The method, apparatus, or non-transitory computer-readable medium of aspect 16, where the one or more threshold voltages are used in comparators to determine information about signals.

Aspect 18: The method, apparatus, or non-transitory computer-readable medium of any of aspects 1 through 17, where the operation includes a trim operation in response to the adjusted trim parameter.

Aspect 19: The method, apparatus, or non-transitory computer-readable medium of any of aspects 1 through 18, where the threshold includes a value relative to a total quantity of expected program erase cycles associated with the address.

Aspect 20: The method, apparatus, or non-transitory computer-readable medium of aspect 19, where the threshold includes 20%, 40%, 60%, or 80% of the total quantity of expected program erase cycles.

Aspect 21: The method, apparatus, or non-transitory computer-readable medium of any of aspects 1 through 20, where the indication of the count of program/erase cycles associated with the address includes one bit of the command.

Aspect 22: The method, apparatus, or non-transitory computer-readable medium of any of aspects 1 through 21, where the indication of the count of program/erase cycles associated with the address is positioned after the address in the command.

Aspect 23: The method, apparatus, or non-transitory computer-readable medium of any of aspects 1 through 22, where the trim parameter is adjusted after higher priority commands are completed by the memory system.

Aspect 24: The method, apparatus, or non-transitory computer-readable medium of any of aspects 1 through 23, where the memory system adjusts the trim parameter for operating the memory system based at least in part on values for the trim parameter stored in the memory system.

Aspect 25: The method, apparatus, or non-transitory computer-readable medium of any of aspects 1 through 24, where the indication of the count of program/erase cycles associated with the address is in one of every N integer commands received by the memory system.

Aspect 26: The method, apparatus, or non-transitory computer-readable medium of any of aspects 1 through 25, where the indication of the count of program/erase cycles associated with the address is in every command received by the memory system.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed, and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily doped, e.g., degenerate, semiconductor region. The source and drain may be separated by a lightly doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a controller associated with a memory device, wherein the controller is configured to cause the apparatus to:
receive a read or write command to perform a programming operation on an address of a memory system, the read or write command including an indication of a count of program/erase cycles associated with the address;
determine whether the count of program/erase cycles associated with the address satisfies a threshold;
adjust a trim parameter for operating the memory system based at least in part on determining that the indication of the count of program/erase cycles satisfies the threshold;

adjusting a duration for performing the programming operation based at least in part on determining that the count of program/erase cycles satisfies the threshold; and perform the programming operation associated with the read or write command using the adjusted trim parameter and the adjusted duration.

2. The apparatus of claim 1, wherein the controller is further configured to cause the apparatus to:
determine whether to adjust a distribution of a states stored in a memory cell based at least in part on determining that the count of program/erase cycles satisfies the threshold, wherein adjusting the trim parameter is based at least in part on determining to adjust the distribution of the states.

3. The apparatus of claim 1, wherein adjusting the trim parameter is based at least in part on determining to adjust the duration for performing the programming operation.

4. The apparatus of claim 1, wherein the controller is further configured to cause the apparatus to:
determine whether to improve a reliability of data stored at the address of the memory system based at least in part on determining that the count of program/erase cycles satisfies the threshold, wherein adjusting the trim parameter is based at least in part on determining to improve the reliability of the data stored at the address.

5. The apparatus of claim 1, wherein the controller is further configured to cause the apparatus to:
determine a value for the adjusted trim parameter based at least in part on values stored in the memory system associated with the count of the program/erase cycles and the trim parameter, wherein adjusting the trim parameter is based at least in part on determining the value.

6. The apparatus of claim 1, wherein the controller is further configured to cause the apparatus to:
receive a second command to perform a second operation on the address of the memory system, wherein the second command fails to include the indication of the count of program/erase cycles associated with the address.

7. The apparatus of claim 1, wherein the address is configured to cause the apparatus to:
a physical block of the memory system;
a virtual block of the memory system; or a group of physical blocks of the memory system.

8. The apparatus of claim 1, wherein the indication of the count comprises an integer value of program/erase cycles associated with the address.

9. The apparatus of claim 1, wherein the indication of the count comprises an integer value of the count of the program/erase cycles associated with the address.

10. The apparatus of claim 1, wherein the indication of the count comprises an index value that indicates the count is in a range of integer values.

11. The apparatus of claim 1, wherein the indication of the count comprises an index value of two bits that indicates whether the count is within one of four ranges.

12. The apparatus of claim 1, wherein a program/erase cycle comprises how often a particular location in the memory system has been accessed.

13. The apparatus of claim 1, wherein:
the trim parameter indicates how the memory system is operated;
the trim parameter indicates a voltage level of signals applied to various components in the memory system;
the trim parameter indicates a duration for applying signals to various components in the memory system; or the trim parameter indicates one or more threshold voltages compared with signals of the memory system.

14. The apparatus of claim 1, wherein the programming operation comprises a trim operation in response to the adjusted trim parameter.

15. The apparatus of claim 1, wherein the threshold comprises a value relative to a total quantity of expected program erase cycles associated with the address.

16. The apparatus of claim 1, wherein the indication of the count of program/erase cycles associated with the address comprises one bit of the read or write command.

17. The apparatus of claim 1, wherein the indication of the count of program/erase cycles associated with the address is positioned after the address in the read or write command.

18. The apparatus of claim 1, wherein the indication of the count of program/erase cycles associated with the address is in one of every N integer commands received by the memory system.

19. A non-transitory computer-readable medium storing code, the code comprising instructions executable by one or more processors to:
receive a read or write command to perform a programming operation on an address of a memory system, the read or write command including an indication of a count of program/erase cycles associated with the address;
determine whether the count of program/erase cycles associated with the address satisfies a threshold;
adjust a trim parameter for operating the memory system based at least in part on determining that the indication of the count of program/erase cycles satisfies the threshold;
adjust a duration for performing the programming operation based at least in part on determining that the count of program/erase cycles satisfies the threshold; and
perform the programming operation associated with the read or write command using the adjusted trim parameter and the adjusted duration.

20. The non-transitory computer-readable medium of claim 19, wherein the instructions are further executable by the one or more processors to:
determine whether to adjust a distribution of a states stored in a memory cell based at least in part on determining that the count of program/erase cycles satisfies the threshold, wherein adjusting the trim parameter is based at least in part on determining to adjust the distribution of the states.

21. The non-transitory computer-readable medium of claim 19, wherein adjusting the trim parameter is based at least in part on determining to adjust the duration for performing the programming operation.

22. A method, comprising:
receiving a read or write command to perform a programming operation on an address of a memory system, the read or write command including an indication of a count of program/erase cycles associated with the address;
determining whether the count of program/erase cycles associated with the address satisfies a threshold;
adjusting a trim parameter for operating the memory system based at least in part on determining that the indication of the count of program/erase cycles satisfies the threshold;

adjusting a duration for performing the programming operation based at least in part on determining that the count of program/erase cycles satisfies the threshold; and performing the programming operation associated with the read or write command using the adjusted trim parameter and the adjusted duration.

23. The method of claim 22, further comprising:
determining whether to adjust a distribution of a states stored in a memory cell based at least in part on determining that the count of program/erase cycles satisfies the threshold, wherein adjusting the trim parameter is based at least in part on determining to adjust the distribution of the states.

24. The method of claim 22, wherein adjusting the trim parameter is based at least in part on determining to adjust the duration for performing the programming operation.

* * * * *